United States Patent
Chen et al.

(10) Patent No.: US 9,685,590 B2
(45) Date of Patent: *Jun. 20, 2017

(54) LIGHT EMITTING DIODE

(71) Applicant: EPISTAR CORPORATION, Hsinchu (TW)

(72) Inventors: Yu-Yun Chen, Taoyuan (TW); Yung-Hsin Lin, Taoyuan (TW); Fang-I Li, Taoyuan (TW); Shyi-Ming Pan, Taoyuan (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/356,183

(22) Filed: Nov. 18, 2016

(65) Prior Publication Data

US 2017/0104134 A1    Apr. 13, 2017

Related U.S. Application Data

(63) Continuation of application No. 14/641,565, filed on Mar. 9, 2015, now Pat. No. 9,502,616.

(30) Foreign Application Priority Data

Sep. 23, 2014    (TW) .............................. 103132866 A

(51) Int. Cl.
| | |
|---|---|
| *H01L 33/40* | (2010.01) |
| *H01L 33/42* | (2010.01) |
| *H01L 33/38* | (2010.01) |
| *H01L 33/32* | (2010.01) |
| *H01L 33/06* | (2010.01) |

(52) U.S. Cl.
CPC ............ *H01L 33/405* (2013.01); *H01L 33/06* (2013.01); *H01L 33/32* (2013.01); *H01L 33/38* (2013.01); *H01L 33/42* (2013.01)

(58) Field of Classification Search
CPC .................................................... H01L 33/405
See application file for complete search history.

(56) References Cited

U.S. PATENT DOCUMENTS

| | | | |
|---|---|---|---|
| 6,969,874 B1 | 11/2005 | Gee et al. | |
| 8,253,157 B2 | 8/2012 | Jorgenson | |
| 9,502,616 B2 * | 11/2016 | Liu ........................ | H01L 33/38 |
| 2006/0054919 A1 | 3/2006 | Matsuda et al. | |
| 2008/0135861 A1 | 6/2008 | Pokrovskiy et al. | |
| 2010/0230713 A1 | 9/2010 | Minemoto et al. | |
| 2011/0297914 A1 | 12/2011 | Zheng et al. | |
| 2014/0054542 A1 | 2/2014 | Han et al. | |
| 2014/0131732 A1 | 5/2014 | Fu et al. | |

FOREIGN PATENT DOCUMENTS

| | | |
|---|---|---|
| TW | 201409740 A | 3/2014 |
| TW | 201417340 A | 5/2014 |
| TW | 201419571 A | 5/2014 |
| WO | 2014035205 A2 | 3/2014 |

* cited by examiner

*Primary Examiner* — Lex Malsawma
(74) *Attorney, Agent, or Firm* — Patterson + Sheridan, LLP

(57) ABSTRACT

The present invention relates to a light-emitting diode (LED), which comprises electrodes having a single metal reflective layer. The single metal reflective layer is thicker than the active layer of the LED. Thereby, at least a portion of light emitted from the active layer is reflected by the single metal reflective layer, and thus enhancing the light-emitting efficiency of the LED.

16 Claims, 6 Drawing Sheets

LIGHT EMITTING DIODE

REFERENCE TO RELATED APPLICATIONS

This application is a continuation application of U.S. patent application Ser. No. 14/641,565, filed on Mar. 9, 2015, now U.S. Pat. No. 9,502,616, which claims the right of priority based on TW application Serial No. 103132866, filed on Sep. 23, 2014, and the content of which are hereby incorporated by reference in their entireties.

FIELD OF THE INVENTION

The present invention relates generally to a light-emitting diode (LED), and particularly to an LED comprising electrodes having a single metal reflective layer.

BACKGROUND OF THE INVENTION

LEDs are solid-state light-emitting devices formed from semiconductor materials that comprise, in generally, III-V compound elements such as gallium phosphide, gallium arsenide, or gallium nitride. By biasing the compound semiconductor, massive electrons and holes encounter and recombine in an active layer of LED, and electrons will fall to lower energy levels with the emission of photons. Therefore, the electrical energy is converted to the light to achieve the effect of light emission.

In the traditional LED structure, electrodes might absorb the light emitted from the active layer, such that the expected light-emitting performance of LED is reduced. Moreover, the light absorbed by the electrodes will be converted into heat, resulting in gradual increase temperature in the electrodes or overheating condition. Thereby, improvement is required.

In order to reduce the absorption of light emitted from the active layer, one of prior arts is to form a reflection layer under electrodes of an LED. Thereby, the absorption is avoided when the light emitted from the active layer contact the electrodes. In addition, because the side surface of the active layer may emit the light, the reflective layer may have a special shape such as ladder- or L-shaped in a cross-section view, so that the light can be multi reflected via the reflection layer and thus enhancing the light-emitting efficiency of LED.

However, the prior art, which is required to add reflection layers under electrodes of LED, increases complexity in fabrication process of LED. Besides, according to different light-receiving conditions under the positive and negative electrode of LED, the reflection layers shall have different structures respectively, that also increase complexity in the fabrication process.

SUMMARY

The present invention discloses a light emitting diode (LED), which comprises a stacked semiconductor layer structure, a first electrode, and a second electrode. The stacked semiconductor layer structure comprises a first-type semiconductor layer, an active layer, and a second-type semiconductor layer. The active layer is disposed between the first-type and the second-type semiconductor layers. The first and second electrodes are disposed on the same side of the stacked semiconductor layer structure. In addition, the first electrode is disposed on the first-type semiconductor layer; the second electrode is disposed on the second-type semiconductor layer. The first electrode includes a single metal reflective layer and a pad layer. The pad layer is disposed on the single metal reflective layer. The thickness of the single metal reflective layer is greater than that of the active layer. Moreover, the height of the bottom of the single metal reflective layer is lower than the height of the bottom of the active layer and the height of the top of the single metal reflective layer is higher than the height of the top of the active layer. Thereby, at least a portion of the light emitted from the active layer is reflected by the single metal reflective layer.

According to an embodiment of the present invention, the LED may further comprise a transparent conductive layer disposed between the second-type semiconductor layer and the second electrode.

According to an embodiment of the present invention, the LED may further comprise a transparent conductive layer disposed between the second-type semiconductor layer and the second electrode. In addition, the height of the top of the single metal reflective layer of the first electrode is not lower than the height of the transparent conductive layer.

According to an embodiment of the present invention, a gap ranged between 7-8 um is further located between the first electrode and the active layer of the LED.

According to an embodiment of the present invention, the material of the first electrode of the LED may include one selected from the group consisting of chrome, aluminum, platinum, gold, titanium, tantalum, ruthenium, rhodium, silver, nickel, lead, and copper.

According to an embodiment of the present invention, the material of the single metal reflective layer of the first electrode of the LED may include one selected from the group consisting of aluminum, platinum, titanium, tantalum, ruthenium, rhodium, silver, nickel, and lead.

According to an embodiment of the present invention, the thickness of the single metal reflective layer of the first electrode of the LED is not less than 1 um.

According to an embodiment of the present invention, the material of the pad layer of the first electrode of the LED includes gold.

According to an embodiment of the present invention, the thickness of the pad layer of the first electrode of the LED is not less than 0.8 um.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
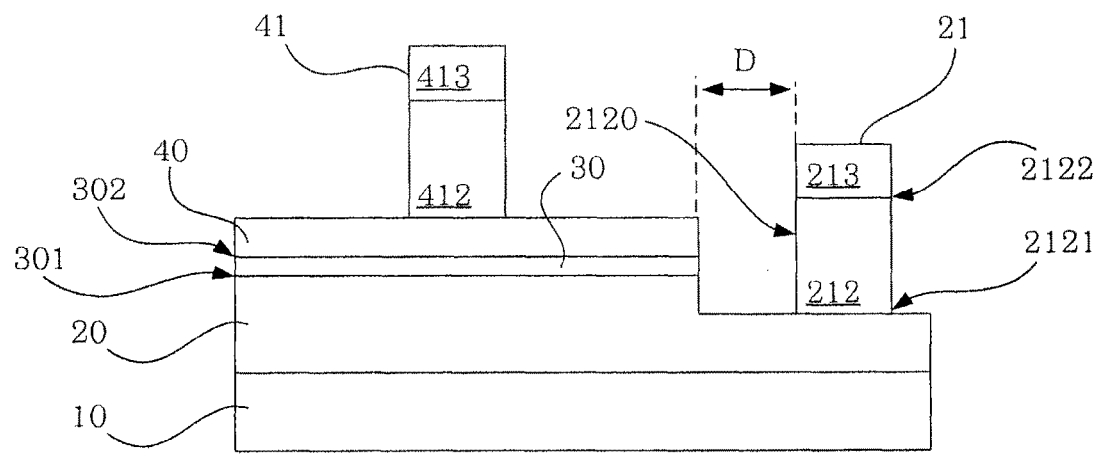
FIG. 1 shows a cross-sectional view of the structure according to a preferred embodiment of the present invention.

Please refer to FIG. 1, a light emitting diode (LED) disclosed in the present invention comprises a stacked semiconductor layer structure disposed on a substrate 10. The stacked semiconductor layer structure comprises, from bottom to top, a first-type semiconductor layer 20, an active layer 30, and a second-type semiconductor layer 40. The active layer 30 is disposed between the first- and the second-type semiconductor layers 20, 40. The second-type semiconductor layer 40 and the active layer 30 do not cover completely the first-type semiconductor layer 20. Instead, a portion of the first-type semiconductor layer 20 is exposed for disposing an electrode. The first- and second-type semiconductor layers 20, 40 can be N-type or P-type gallium nitride-based semiconductors. The active layer 30 can be a multiple quantum well layer. Bias voltages can be supplied via electrodes to make the active layer 30 emit light. Nonetheless, the present invention does not limit the types of these semiconductor materials.

According to the present invention, a first electrode 21 and a second electrode 41 are disposed on the same side of the stacked semiconductor layer structure of the LED. The first electrode 21 is disposed on the first-type semiconductor layer 20; the second electrode 41 is disposed on the second-type semiconductor layer 40. The first electrode 21 includes a single metal reflective layer 212 and a pad layer 213, where the pad layer 213 is disposed on the single metal reflective layer 212. The material of the single metal reflective layer 212 includes aluminum or aluminum alloy with a thickness not less than 1 um. The single metal reflective layer 212 is not the aluminum thin film having a negligible thickness applied in the LED according to the prior art. Particularly, the thickness of the single metal reflective layer 121 according to the present invention is greater than that of the active layer 30. Accordingly, the structure is beneficial to the enhancement of light-emitting efficacy of LEDs. The detail is described in the description regarding the experimental results show in FIGS. 5A, 5B, and 6A to 6D below.

Figure 4:
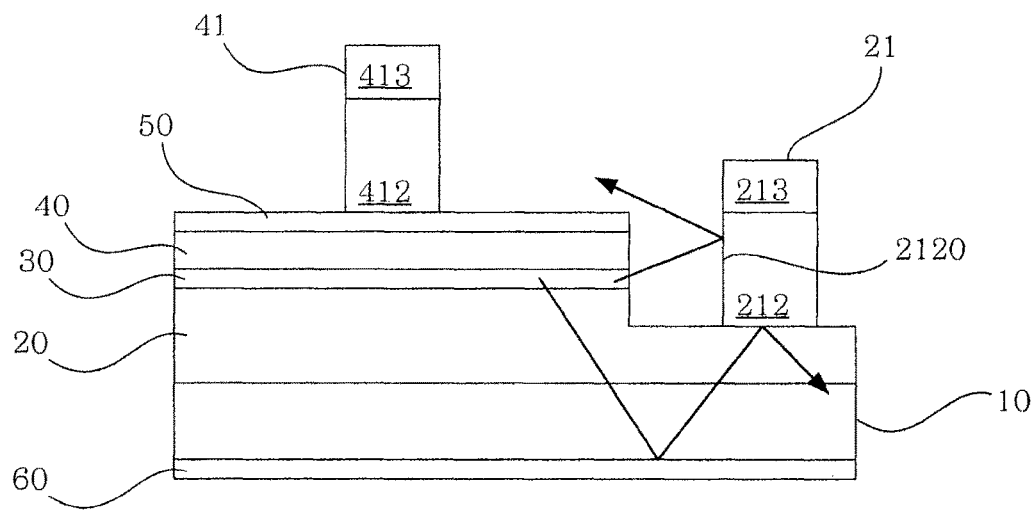
FIG. 4 shows a schematic diagram of the path of light reflection according to a preferred embodiment of the present invention.

According to a preferred embodiment as disclosed in FIG. 1, the height of the bottom 2121 of the single metal reflective layer 212 is lower than the height of the bottom 301 of the active layer 30, and the height of the top 2122 of the single metal reflective layer 212 is higher than the height of the top 302 of the active layer 30. Consequently, at least a portion of the light emitted from the side surface of the active layer 30 will be reflected by the single metal reflective layer 212, as shown in FIG. 4. In other words, by increasing thickness of the single metal reflective layer 212 of the first electrode 21, the side surface of the single metal reflective layer 212 can be used as a reflective surface 2120. Further, the single metal reflective layer 212 is located near to one side of the active layer 30 and separated by a gap D, it can reflect a portion of the light emitted from the active layer 30, which means the path of light reflection is increased and the light-emitting efficiency of the LED can be improved. Wherein the gap D described above is ranged between 7-8 um.

The material of the first electrode 21 may include one selected from the group consisting of chrome, aluminum, platinum, gold, titanium, tantalum, ruthenium, rhodium, silver, nickel, lead, copper, and an alloy thereof. The material of the single metal reflective layer 212 may include one selected from the group consisting of aluminum, platinum, titanium, tantalum, ruthenium, rhodium, silver, nickel, lead, and an alloy thereof. So that the single metal reflective layer 212 may be formed as a thick platinum layer, a thick titanium layer, a thick tantalum layer, a thick ruthenium layer, a thick rhodium layer, a thick silver layer, a thick nickel layer, a thick lead layer or etc. According to a preferred embodiment, the material of the single metal reflective layer 212 may be aluminum or aluminum alloy, and is thickened to form a reflective surface on the side of the structure. Hence, it is not required to manufacture an additional reflective layer on the side or bottom of the first electrode 21.

Furthermore, as shown in FIGS. 5A, 5B, and 6A to 6D, given the condition of not altering the composition of the other materials in the first electrode 21, although using the single metal reflective layer 212 can improve the luminous intensity of the LED according to the present invention, the electrical properties of the LED are affected. Therefore, according to a preferred embodiment of the present invention, the first electrode 21 further includes the gold formed pad layer 213 having a thickness not less than 0.8 um when the thickness of the aluminum single metal reflective layer 212 is not less than 1 um. For example, when the thickness of the single metal reflective layer 212 is 1.5 um and the thickness of the pad layer 213 is 1 um, in addition to improve the light-emitting efficiency, the electrical properties of the LED according to the embodiment of the present invention are the same as or close to that of the regular LED. Besides, in order to reduce the manufacturing process, the first and second electrodes 21, 41 are preferably fabricated in the identical process. Which means the first and second electrodes 21, 41 of the LED according to the embodiment will have the same material and structure while the performance will be similar or the same as described above. In addition, in order to make the side surface of the single metal reflective layer 212 be utilized in reflection effectively, the pad layer 213 does not cover the side surface of the single metal reflective layer 212. According to a preferred embodiment, the area of the pad layer 213 is the same as that of the single metal reflective layer 212.

Figure 2:
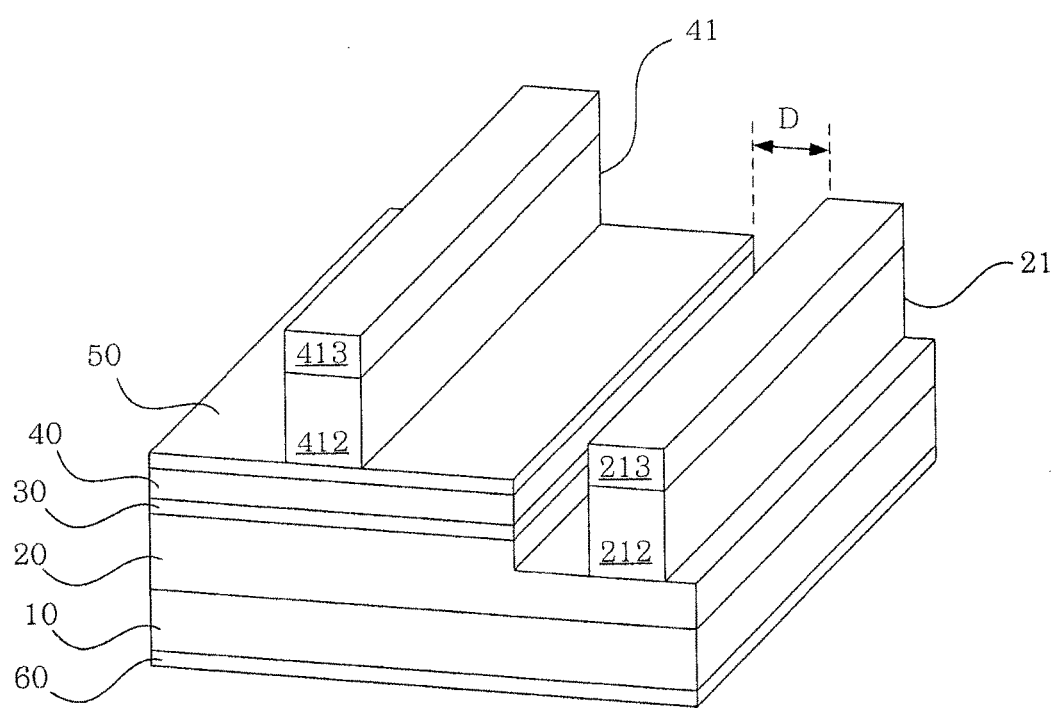
FIG. 2 shows a three-dimensional view of the structure according to a preferred embodiment of the present invention.
Figure 3:
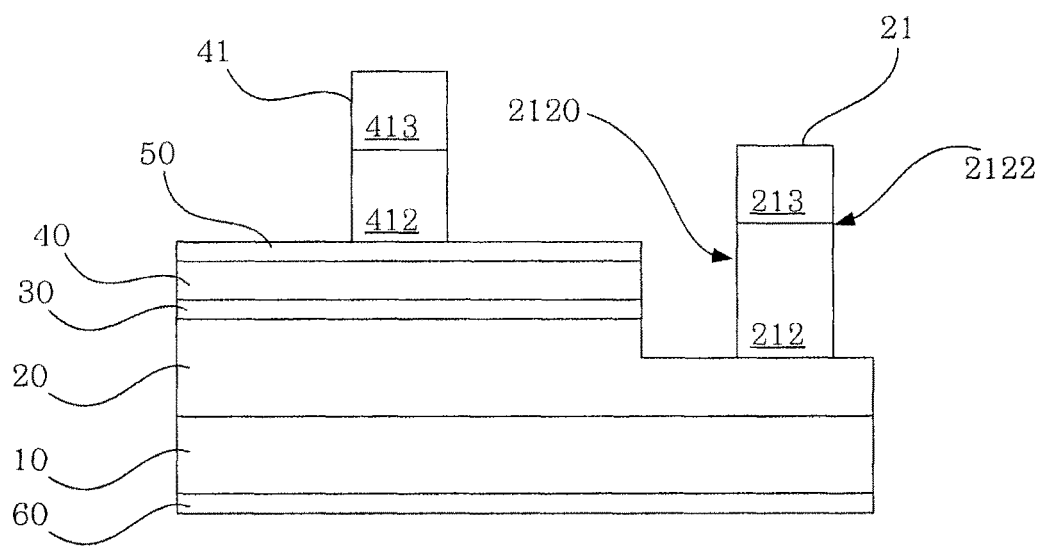
FIG. 3 shows a cross-sectional view of the structure according to another preferred embodiment of the present invention.

Please refer to FIGS. 2 and 3. An LED according to the present invention may further comprise a transparent conductive layer 50 disposed between the second electrode 41 and the second-type semiconductor layer 40. According to another preferred embodiment, the height of the top 2122 of the single metal reflective layer 212 is not lower than that of the transparent conductive layer 50. In addition, a reflective layer 60 is disposed under the substrate 10 of the LED for reflecting the downward light emitted from the active layer 30 upwards and enhancing the brightness of the LED. Moreover, a side surface or the side reflective surface 2120 of the first electrode 21 is parallel with a side surface formed by the active layer 30, the second-type semiconductor layer 40 and the transparent conductive layer 50, and a gap D exists between the surfaces. A side surface of the second electrode 41 corresponding to the first electrode 21 is parallel with the side surface or the side reflective surface 2120 of the first electrode 21. Accordingly, in addition to emitting more uniform light, the distribution of currents in the LED according to the present invention is more even, which improves the light-emitting efficiency of the LED according to the present invention.

FIG. 4 shows a schematic diagram in which the light emitted from the active layer 30 is reflected by the side reflective surface 2120 of the single metal reflective layer 212 of the first electrode 21. The bottom of the single metal reflective layer 212 can provide reflection function as well. Thereby, it is not required to fabricate an additional reflective layer between the electrodes and the semiconductor layers by using the electrode structure disclosed in the present invention.

Figure 5A:
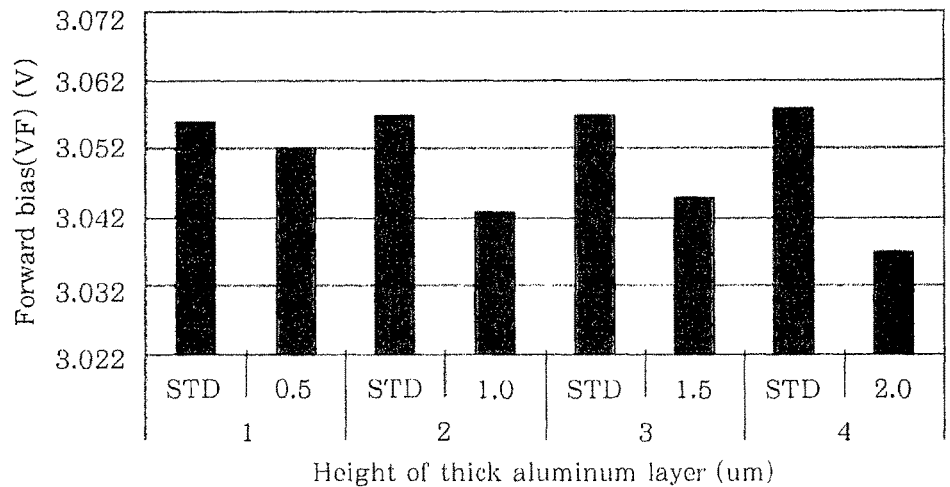
FIG. 5A shows the comparison in electrical property of experimental results between a regular LED and the LED having a single metal reflective layer with different thicknesses according to the present invention.
Figure 5B:
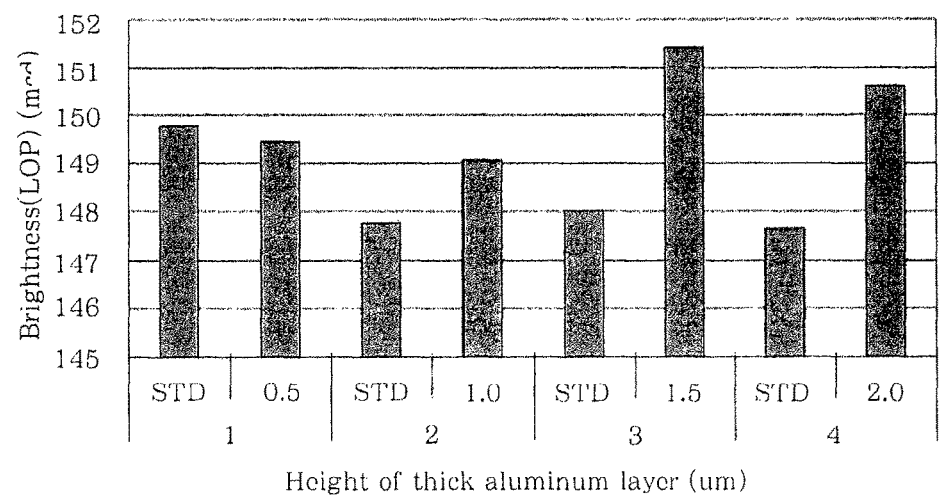
FIG. 5B shows the comparison in luminous intensity of experimental results between a regular LED and the LED having a single metal reflective layer with different thicknesses according to the present invention.
Figure 6A:
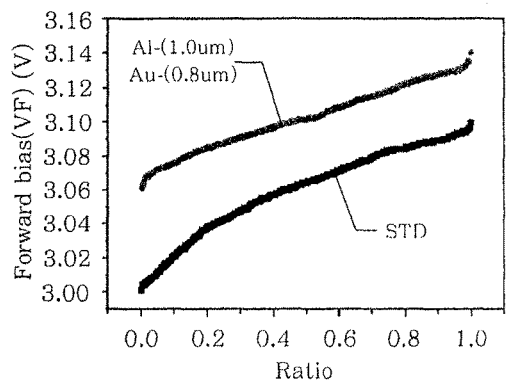
FIG. 6A-6D show comparisons in the electrical property of experimental results between a regular LED and the LED with combinations of the single metal reflective layer and the pad layer with different thicknesses according to the present invention.
Figure 6B:
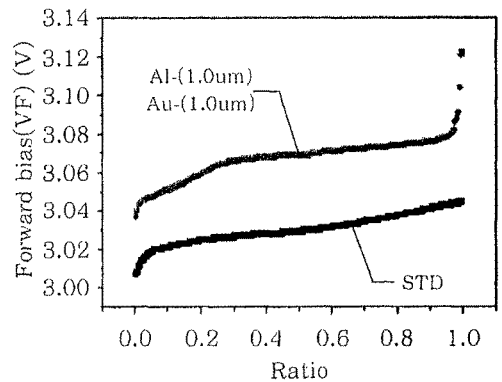
Figure 6C:
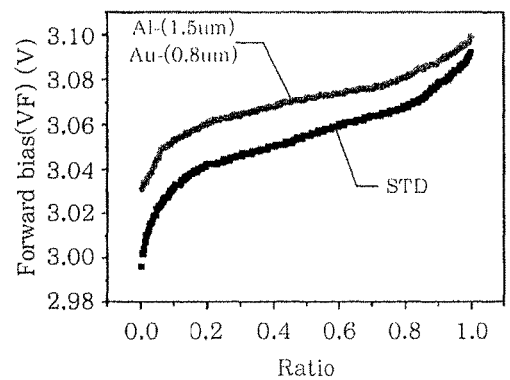
Figure 6D:
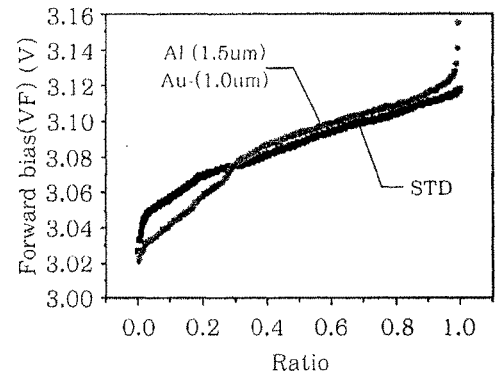

FIGS. 5A and 5B show the comparison in electrical property and luminous intensity of four sets of experimental results between the regular LEDs (STD) and the LEDs having a single metal reflective layer with different thicknesses according to the present invention. The thicknesses of the pad layers of the regular LEDs and the LEDs according to the present invention are 1.8 um and formed by gold. The thicknesses of the single metal reflective layers of the LEDs according to the present invention made by aluminum are 0.5, 1.0, 1.5, and 2.0 um respectively in the 1'st to 4'th set. As shown in the figures, except the 1'st set that the difference of experimental results is unobvious, the forward bias voltage (V.sub.F) of the LEDs according to the present invention is lower than that of the regular LEDs by more than 10 mV in the other three sets, while the luminous intensity (LOP) is improved by 0.01 to 0.04 mcd. According to the experimental results, the luminous intensity of the LED according to the present invention is improved by approximately 1-2%.

FIG. 6A-6D show comparisons in electrical property of experimental results between the regular LEDs (STD) and the LEDs with combinations of the single metal reflective layer and the pad layer with different thicknesses and sampling ratios according to the present invention. The sampling ratios in the figures are normalized. As shown in the FIG. 6D, the electrical property of the LEDs according to the present invention is very close to that of the regular LEDs, wherein the first electrode 21 comprises a 1.5-um-thick aluminum single metal reflective layer 212 and a 1-um-thick gold pad layer 213. Which means, under the condition of said combination of the single metal reflective layer and the pad layer, the electrical property of the LED according to the present invention is the same as that of the regular LED while providing extra light-emitting efficiency.

To sum up, the present invention discloses an LED comprising a single metal reflective layer having a thick aluminum film in its electrode structure, so that a portion of the light emitted from the active layer can be reflected by the side surface of the single reflected metal layer. By increasing the path of light reflection, the light-emitting efficiency can be enhanced. Besides, the electrical performance of the LED according to the present invention is maintained by the combination of the pad layer and the single metal reflective layer in particular ratio.

However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A light-emitting diode, comprising:
a first-type semiconductor layer;
an active layer over the first-type semiconductor layer;
a second-type semiconductor layer over the active layer;
a first electrode next to a sidewall of the active layer, wherein the first electrode comprises a single metal reflective layer and a pad layer disposed over the single metal reflective layer; and
a reflective layer under the first-type semiconductor layer;
wherein the height of the bottom of the single metal reflective layer is lower than the height of the bottom of the active layer, the height of the top of the single metal reflective layer is higher than the height of the top of the active layer.

2. The light-emitting diode of claim 1, further comprising a second electrode over the second-type semiconductor layer.

3. The light-emitting diode of claim 2, further comprising a transparent conductive layer disposed between the second-type semiconductor layer and the second electrode.

4. The light-emitting diode of claim 1, wherein a gap with a width between 7 um and 8 um is formed between the first electrode and the active layer.

5. The light-emitting diode of claim 1, wherein the material of the single metal reflective layer includes aluminum or aluminum alloy.

6. The light-emitting diode of claim 1, wherein the material of the single metal reflective layer includes one selected from the group consisting of platinum, titanium, tantalum, ruthenium, rhodium, silver, nickel, and lead.

7. The light-emitting diode of claim 1, wherein the thickness of the single metal reflective layer is not less than 1 um.

8. The light-emitting diode of claim 7, wherein the thickness of the single metal reflective layer is from 1 um to 2 um.

9. The light-emitting diode of claim 1, wherein the material of the pad layer includes gold.

10. The light-emitting diode of claim 1, wherein the thickness of the pad layer is not less than 0.8 um.

11. The light-emitting diode of claim 1, wherein the single metal reflective layer directly connects to the pad layer.

12. The light-emitting diode of claim 1, wherein the area of the single metal reflective layer is substantially the same as that of the pad layer.

13. The light-emitting diode of claim 1, wherein the pad layer does not cover a side surface of the single metal reflective layer.

14. The light-emitting diode of claim 1, wherein a portion of the upper surface of the first-type semiconductor layer is exposed and the first electrode is disposed on the exposed upper surface.

15. The light-emitting diode of claim 1, further comprising a substrate interposed between the reflective layer and the first-type semiconductor layer.

16. The light-emitting diode of claim 1, wherein at least a portion of light emitted from the sidewall of the active layer is reflected by the single metal reflective layer.

* * * * *